United States Patent [19]

Kawano

[11] Patent Number: 4,614,911
[45] Date of Patent: Sep. 30, 1986

[54] BALANCED MODULATOR CIRCUIT
[75] Inventor: Mitsumo Kawano, Honjo, Japan
[73] Assignee: Kabushiki Kaisha Toshiba, Kawasaki, Japan
[21] Appl. No.: 680,789
[22] Filed: Dec. 12, 1984
[30] Foreign Application Priority Data Dec. 17, 1983 [JP] Japan ............................... 58-238671

[51] Int. Cl.⁴ ....................... H03C 1/54; H03B 19/10; H03D 13/00
[52] U.S. Cl. .................................... 329/101; 307/498; 307/516; 332/16 T; 332/31 T
[58] Field of Search ....................... 329/101, 102, 103; 332/9 T, 16 T, 31 T; 307/516; 328/160; 307/498; 364/841; 331/8

[56] References Cited

U.S. PATENT DOCUMENTS 3,550,040 12/1970 Sinusas ................................. 332/44

FOREIGN PATENT DOCUMENTS 1459760 12/1976 United Kingdom .

OTHER PUBLICATIONS

Analog Integrated Circuits—Operational Amplifiers and Analog Multipliers—by Miklos Herpy—May 7, 1980—pp. 438-451.

Primary Examiner—Siegfried H. Grimm
Attorney, Agent, or Firm—Cushman, Darby and Cushman

[57] ABSTRACT

A multiplier circuit is equipped with first and second differential amplifier circuits and a load circuit. These differential amplifier circuits are comprised of differential pairs of transistors for amplifying a first signal and outputting mutually opposed differential output signals. A switching circuit is comprised of two groups of differential pairs of transistors. In order to increase the dynamic range of the output signals, this switching circuit controls the base voltage of the differential amplifier pair of transistors, which are constructed of the first and second differential amplifier circuits, and alternately operates these first and second differential amplifier circuits. Accordingly, an opposing signal of the output signals of these first and second differential amplifier circuits is supplied to the load circuit. It is, therefore, possible to obtain a product signal of the first and second signals from the output terminals, which are connected to the node of the load circuit and the first and second differential amplifier circuits.

11 Claims, 6 Drawing Figures

BALANCED MODULATOR CIRCUIT

BACKGROUND OF THE INVENTION

This invention relates to an improvement in a multiplier circuit that is often used as a frequency converter or synchronous detector.

A multiplier circuit that is often used as a frequency converter or synchronous detector is shown in FIG. 1. This multiplier is identical to that shown in FIGS. 1 and 5 of U.S. Pat. No. 3,550,040, and is commonly referred to as a double-balanced multiplier. The signal from signal source S1 is supplied phase-inverted to a differential amplifier which comprises transistors Q1, Q2, resistors R1, R2 and a constant current source IO1. The carrier signal from the carrier signal source S2 is supplied phase-inverted to the nodes of the bases of the transistors Q3, Q6 and of the bases of transistors Q4, Q5. The product output by this circuit is output from output terminal O1, which is connected to the node of resistor R3 and the collectors of transistors Q3, Q5 or from the output terminal O2, which is connected to the node of resistor R4 and the collectors of transistors Q4, Q6.

With a multiplier circuit having the structure described above, output signals corresponding to the signals from signal source S1 are output from the collectors of transistors Q1, Q2. Transistors Q3–Q6 selectively turn ON and OFF in response to the voltage level of the carrier signal from carrier signal source S2 so differential signals of mutually opposite phases are selectively supplied to output terminals O1, O2. For example, when transistors Q3, Q6 are ON, the collector output of transistor Q1 is supplied to output terminal O1 via transistor Q3, and when transistors Q4, Q5 are ON, the collector output of transistor Q2 is supplied to output terminal O1 via transistor Q5. In this way, it is possible to obtain the product output of the signals from the signals sources S1, S2 at the output terminals O1, O2.

With this kind of multiplier circuit, load resistor R3, transistor Q3 or Q5, transistor Q1 or Q2, resistor R1 or R2, and constant current source IO1 are connected in series between source voltage Vcc and ground. When the source voltage is low, the dynamic range of the output signal becomes insufficient and, consequently, the operating capacity of the multiplier is decreased. For example, if the source voltage is set at 5 V, the bias voltage of the constant current source IO1 at 2.5 V and the bias voltage of the carrier signal at 3.5 V, it will be impossible to obtain a product signal with a dynamic range over 1 V. This is not sufficient for practical purposes. The product output of this circuit, therefore, must be amplified, which results in more susceptibility to noise.

SUMMARY OF THE INVENTION

The object of this invention is to provide a multiplier circuit that outputs a signal with a large dynamic range.

In order to achieve this object, the multiplier circuit of this invention comprises:

first differential amplifying means, for differentially amplifying a first signal, which has a first differential pair of transistors, and first and second output terminals from which first and second differentially amplified signals having opposite phases are output;

second differential amplifying means for amplifying the first signal, which has a second differential pair of transistors, and a third output terminal connected to said second differential output terminal from which a third differentially amplified signal is output in phase with the first differentially amplified signal, and a fourth output terminal connected to said first output terminal, from which a fourth differentially amplified signal is output in phase with the second differentially amplified signal;

a first signal supply means connected to said first and second differential amplifying means for supplying the first signal to the first and second differential amplifying means;

load means connected to at least either node of the first and fourth output terminals of the first and second differential amplifying means or the node of the second and third terminals;

switching means for controlling the voltage of the bases of the first and second differential pairs of transistors in response to the second signal, selectively operating the first and second differential amplifier means, and for obtaining a product signal of the first and second signals from the node of the load means and the first and second differential amplifier means; and a second signal supply means connected to the switching means for supplying the second signal to the switching means.

With a multiplier circuit having this kind of structure, the first and second differential amplifier means are turned ON and OFF by the switching means controlling the base voltage of the first to fourth transistors. Accordingly, the multiplier circuit of this invention is able to broaden the dynamic range of the output signal by the amount of voltage drop of one transistor compared with the prior art multiplier circuit in which the transistors are 2-stage serial connected. Therefore, the peripheral circuit construction can be simplified. The output signal of the device of this invention is also little affected by noise.

DETAILED DESCRIPTION OF THE PREFERRED EMBODIMENT

Figure 1:
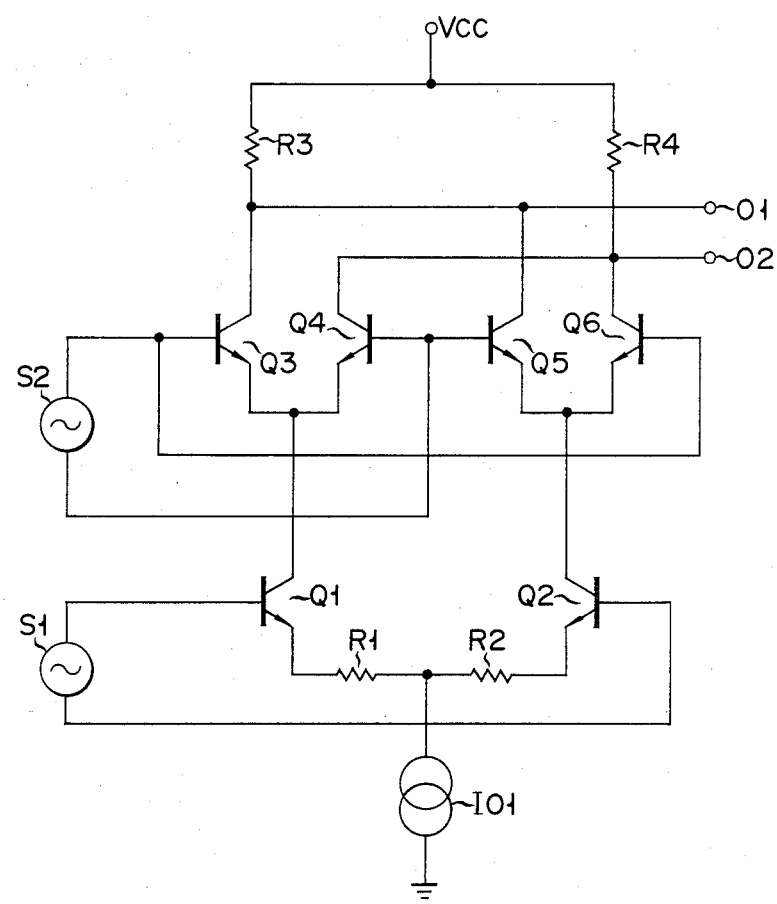
FIG. 1 is a circuit diagram of the prior art multiplier circuit.
Figure 2:
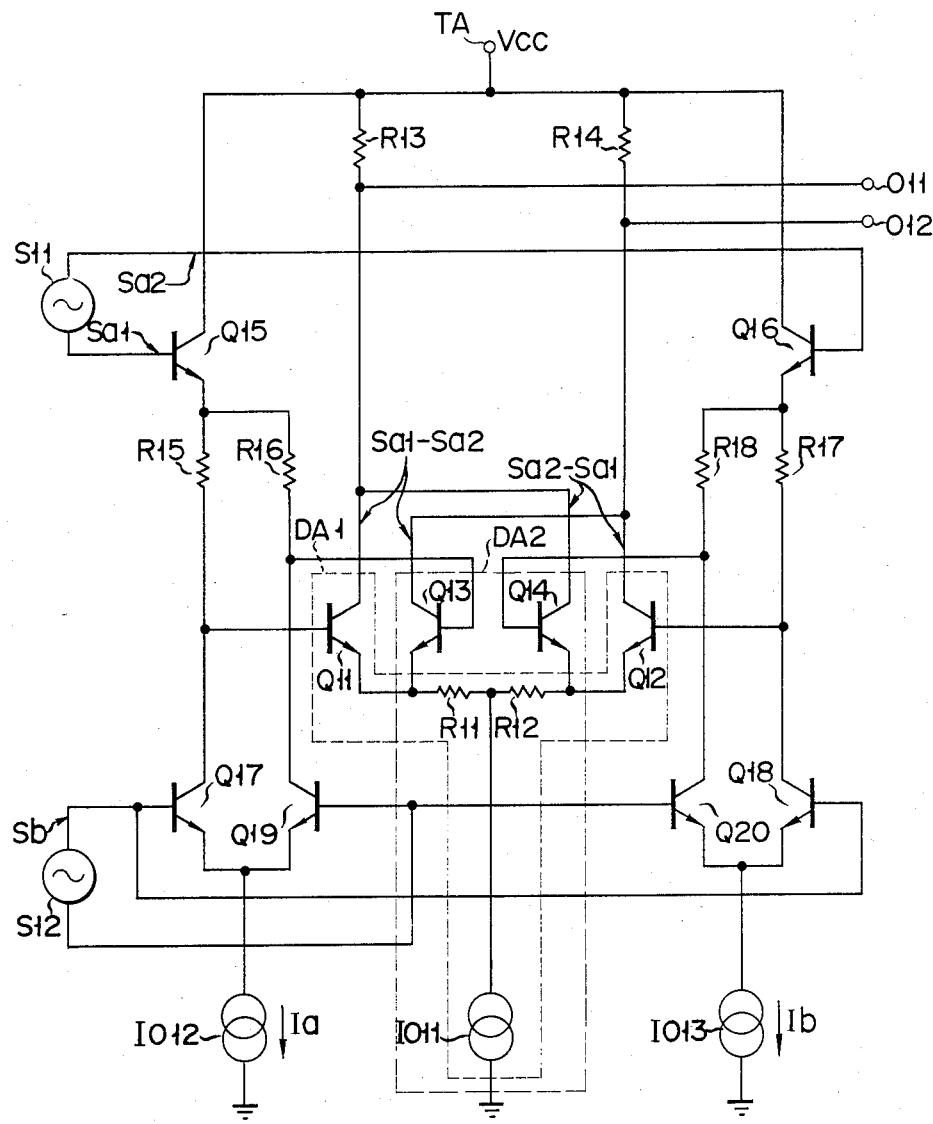
FIG. 2 is a circuit diagram of the first embodiment of the multiplier circuit of this invention.

The following is a detailed description of the first embodiment of this invention taken in conjunction with FIG. 2.

The first differential amplifer circuit DA 1 is constructed of first and second transistors Q11, Q12. The emitter of the first transistor Q11 is connected to one end of resistor R11. The other end of the resistor R11 is connected to the one end of a resistor R12. The other end of the resistor R12 is connected to the emitter of the transistor Q12. The node of resistors R11, R12 is grounded through constant current source IO11. The second differential amplifier circuit DA2 is constructed of a third transistor Q13 the emitter of which is connected to the node of resistor R11 and first transistor Q11, and a fourth transistor Q14 the emitter of which is connected to the node of resistor R12 and second transistor Q12. The resistors R11, R12 and constant current source IO11 are used jointly by the first and second differential amplifier circuits DA1, DA2.

The collectors of the first and fourth transistors Q11, Q14 are connected together and the node is connected to the output terminal O11 and to the power source terminal TA through load resistor R13. Power source voltage Vcc is applied to the terminal TA. The collectors of the second and third transistors are connected together and the node is connected to the output terminal O12 and to the power source terminal TA through the load resistor R14.

The bases of the first and third transistors Q11, Q13 are connected to the emitter of the fifth transistor Q15 via resistors R15, R16, respectively and, similarly, the bases of the second and fourth transistors Q12, Q14 are connected to the emitter of the sixth transistor Q16 via resistors R17, R18, respectively. The fifth and sixth transistors Q15, Q16 are buffer transistors for impedance conversion. The base of the fifth transistor Q15 is connected to one output terminal of the first signal source S11 and the base of the sixth transistor Q16 is connected to the other output terminal. The collectors of the fifth and sixth transistors Q15, Q16 are connected to the power source terminal TA. The bases of the first and second transistors Q11, Q12 of the first differential amplifier circuit DA1 are respectively connected to the collectors of the seventh and eighth transistors Q17, Q18, the bases of which, in turn, are connected to one output terminal of the carrier signal source S12. Similarly, the bases of the third and fourth transistors Q13, Q14 of the second differential amplifier circuit DA2 are respectively connected to the collectors of the ninth and tenth transistors Q19, Q20, the bases of which are connected to the other output terminal of the carrier signal source S12. The emitters of the seventh and ninth transistors Q17, Q19 are connected together, and are grounded through constant current source IO12. The seventh and ninth transistors Q17, Q19 are a differential pair. Similarly, the emitters of the eighth and tenth transistors Q18, Q20 are connected together, and grounded through constant current source IO13. The eighth and tenth transistors Q18, Q20 are also a differential pair. The source voltage is set at 5 V, the resistance of resistors R11, R12 at 1.4 KΩ, resistors R13, R14 at 8 KΩ, resistors R15–R18 at 3 KΩ, the current value of constant current source IO11 at 0.4 mA, and the constant current sources IO12, IO13 at 0.1 mA. In an actual circuit, for example, bias circuits and a protection circuit are required, but a description has been omitted.

The following is a description of the operation of a multiplier circuit having the above construction.

For reasons of simplicity, the signal Sa from signal source S11 is divided into output signal Sa1 of one output terminal and signal Sa2 of the other output terminal. In this case, for example, signal Sa1 fluctuates with the center of fluctuation being a certain constant voltage (the bias voltage of signal source S11), and signal Sa2 is the direct current signal of that constant voltage. When the signal source S11 is a differential amplifier, signal Sa1 fluctuates with the center of fluctuation being a certain constant voltage, and signal Sa2 also fluctuates about that center in opposite phase to signal Sa1.

Signal Sa1 is supplied to the base of the first transistor Q11 of the first differential amplifier circuit DA1 through the fifth transistor Q15 for impedance conversion and resistor R15. Signal Sa2 is supplied to the base of the second transistor Q12 of the first differential amplifier circuit DA2 through the sixth transistor Q16 for impedance conversion and resistor R17. Similarly, signal Sa1 is supplied to the base of the third transistor of the second differential amplifier circuit DA2 via the fifth transistor Q15 and resistor R16. Signal Sa2 is supplied to the base of the fourth transistor Q14 of the second differential amplifier circuit DA2 via the sixth transistor Q16 and resistor R18. Accordingly, the first differentially amplified signal (Sa1–Sa2) is output from the collector of the first transistor Q11 of the first differential amplifier circuit, and a second differentially amplified signal (Sa2–Sa1) of opposite phase to the first differentially amplified signal is output from the collector of the second transistor Q12.

Similarly, a third differentially amplified signal identical to the first differentially amplified signal (Sa1–Sa2) is output from the collector of the third transistor Q13 of the second differential amplifier, and a fourth differentially amplified signal identical to the second differentially amplified signal (Sa2–Sa1) is output from the collector of the fourth transistor Q14.

The seventh to tenth transistors Q17–Q20 selectively turn the two differential amplifier circuits DA1, DA2 ON and OFF in response to the level of the carrier signal Sb from the carrier signal source S12. As was stated earlier, the seventh and ninth transistors Q17, Q19 and eighth and tenth transistors Q18, Q20 form differential pairs and, consequently, one of the transistors of each pair (for example, Q17, Q18) are turned ON in response to the carrier signal Sb, and the other transistors of each pair (for example, Q19, Q20) are turned OFF. The collector voltage of the ON transistors drops and, as a result, the base voltage of the first to fourth transistors Q11 to Q14 connected to the seventh-tenth transistors Q17–Q20 that are ON, drops, and those transistors are turned OFF.

For example, if it is assumed that a carrier signal Sb is output such that the base voltage of the seventh and eighth transistors Q17, Q18 is lower than that of the ninth and tenth transistors Q19, Q20, then the seventh and eighth transistors Q17, Q18 are turned OFF, and the ninth and tenth transistors Q19, Q20 are turned ON. Because Q19 and Q20 are ON, the currents Ia, Ib of the constant current sources IO12, IO13 flow in resistors R16, R18, respectively, and there is a voltage drop in these resistors R16, R18 and a base voltage drop in the third and fourth transistors Q13, Q14 of the second differential amplifier circuit DA2. Consequently, the third and fourth transistors Q13, Q14 are turned OFF so the second differential amplifier circuit DA2 is turned OFF.

On the other hand, because the seventh and eighth transistors Q17, Q18 are turned OFF, the base voltages of the first and second transistors Q11, Q12 of the first differential amplifier circuit DA1 do not drop and, accordingly, the first and second transistors Q11, Q12; i.e., the first differential amplifier circuit is turned ON.

Next, if it is assumed that a carrier signal Sb is output such that the base voltage of the seventh and eighth transistors Q17, Q18 is higher than that of the ninth and tenth transistors Q19, Q20, then the seventh and eighth transistors Q17, Q18 are turned ON and the ninth and tenth transistors Q19, Q20 are turned OFF. Because the seventh and eighth transistors Q17, Q18 are turned ON, the currents Ia, Ib of the constant current sources IO12, IO13 flow in the resistors R15, R17, respectively. There is a consequent voltage drop at these resistors R15, R17, and the base voltage of the first and second transistors Q11, Q12 of the first differential amplifier circuit DA1 drops. The first and second transistors Q11, Q12 are therefore turned OFF so the first differential amplifier circuit DA1 is turned OFF.

On the other hand, because the ninth and tenth transistors Q19, Q20 are turned OFF, the base voltage of the third and fourth transistors Q13, Q14 of the second differential amplifier circuit DA2 does not drop and, accordingly, the third and fourth transistors Q13, Q14, i.e., the second differential amplifier circuit DA2 is turned ON. In this manner, the seventh to tenth transistors Q17–Q20 perform a switching operation in response to the voltage level of the carrier signal Sb so that the two differential amplifier circuits DA1 and DA2 are selectively turned ON and OFF.

As was stated earlier, the node of the collectors of the first and fourth transistors Q11, Q14, which output the first and fourth differentially amplified signals, is connected to the output terminal O11. Accordingly, when the first differential amplifier circuit is ON, the output terminal O11 outputs the first differentially amplified signal (Sa1-Sa2) and, when the second differential amplifier circuit is ON, a fourth differentially amplified signal (Sa2-Sa1) is output. So, opposing-phase differentially amplified signals are alternately output from the output terminal O11 in response to the level of the carrier signal Sb; i.e., a multiplied signal of signals Sb and Sa is output.

The gain G1 of the output signal of output terminal O11 when the first differential amplifier circuit DA1 is turned ON is shown in Equation (1) and gain G2 when the second differential amplifier circuit DA2 is turned ON is shown in Equation (2).

$$G1 = -\frac{R13}{R11 + R12} \quad (1)$$

$$G2 = +\frac{R13}{R11 + R12} \quad (2)$$

Similarly, when the first differential amplifier circuit DA1 is ON, a second differentially amplified signal is output from output terminal O12 and, when the second differential amplifier circuit DA2 is ON, a third differentially amplified signal is output. Namely, a signal which is the product of signals Sa and Sb and which is of opposite polarity to the signal output from the output terminal O11 is output from output terminal O12 in response to the level of carrier signal Sb.

The gain G3 of signal from output terminal O12 when the first differential amplifier circuit DA1 is ON is shown in the Equation (3) and the gain G4 when the second differential amplifier circuit DA2 is ON is shown in Equation (4).

$$G3 = +\frac{R14}{R11 + R12} \quad (3)$$

$$G4 = -\frac{R14}{R11 + R12} \quad (4)$$

Figure 3A:
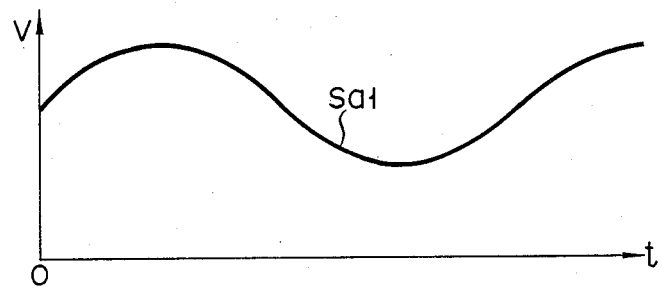
FIGS. 3A to 3D are signal waveform diagrams showing the operation of the multiplier circuit of FIG. 2.
Figure 3B:
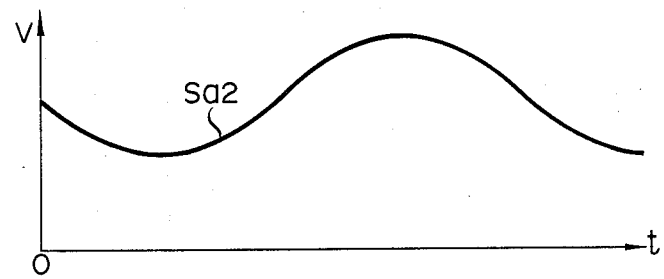
Figure 3C:
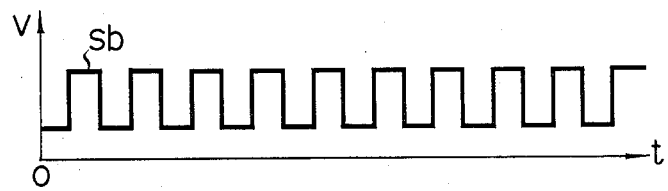
Figure 3D:
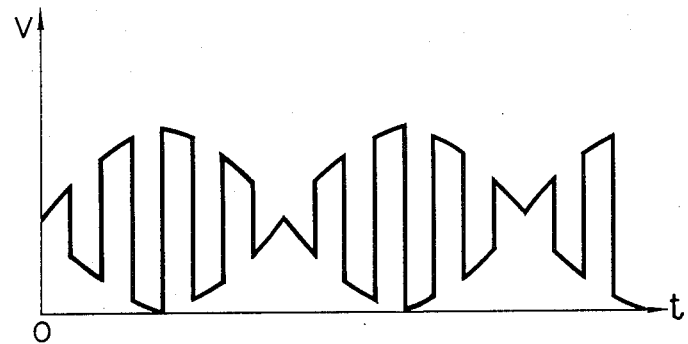

For example, if it is assumed that signal Sa1 is the one shown in FIG. 3A, Sa2 in FIG. 3B and carrier signal Sb in FIG. 3C, then the waveform of a product output signal such as that shown in FIG. 3D will be output from output terminals O11 and O12.

In the multiplier circuit of this embodiment, output terminals O11 and O12 were provided, but one output terminal is sufficient. In which case, if only output terminal O11 is used, load resistor R14 is not required, or if only output terminal O12 is used, load resistor R13 is not required. Also, the first and second differential amplifier circuits DA1, DA2 use resistors R11, R12 in common, but corresponding resistors may be provided for each differential amplifier circuit. Transistors Q15, Q16 for input impedance conversion were used, but if the output impedance of the signal source S11 is not a consideration, these transistors may be omitted.

In the multiplier circuit structure shown in FIG. 2, the transistors for the differential amplifier circuits and the transistors for switching are connected in parallel and, accordingly, it is possible to make the dynamic range larger by the amount of the voltage drop of one transistor between the power source terminal TA and ground, as compared to the prior art multiplier circuit in which two transistors are connected in series. Accordingly, even if the source voltage Vcc is low, it is possible to guarantee a large proportion of the dynamic range in relation to the source voltage Vcc. For example, if the source voltage Vcc is set at 5 V and the bias voltage of the constant current sources IO12, IO13 at 1 V, then, in this embodiment, the base voltages of the first to fourth transistors Q11–Q20 are controlled to turn them ON and OFF so it is possible to set the bias voltage of signal Sa at 2.5 V at the base of the first to fourth transistors Q11–Q14. Accordingly, the dynamic range of the product output signal can be assured at about 2 V, which is twice that of the prior art. The result is a simpler peripheral circuit construction and an output signal which is not affected by noise.

What is claimed is:

1. A circuit comprising:
   first differential amplifier means, for differentially amplifying a first signal, and including a first differential pair of transistors, and first and second output terminals from which first and second differentially amplified signals having opposite phases are output;
   second differential amplifier means, for differentially amplifying said first signal, and including a second differential pair of transistors, a third output terminal coupled to said second output terminal from which a third differentially amplified signal is output in phase with said first differentially amplified signal, and a fourth output terminal coupled to said first output terminal from which a fourth differentially amplified signal is output in phase with said second differentially amplified signal;
   first signal supply means coupled to said first and second differential amplifier means, for supplying said first signal to said first and second differential amplifier means;
   load means coupled to at least either node of said first and fourth output terminals of said first and second differential amplifier means or the node of said second and third output terminals;
   switching means for controlling the voltage of the bases of said first and second differential pairs of transistors in response to a second signal to selectively operate said first and second differential amplifier means, and for obtaining a product signal of said first and second signals from the node of said load means and said first and second differential amplifier means, and including a third differential pair of transistors, which differentially amplifies said second signal, and a fourth differential pair of transistors, which differentially amplifies said second signal, the collectors of said third differential pair of transistors being coupled to the respective bases of a first pair of transistors of said first and second pairs of differential transistors, and the collectors of said fourth differential pair of transistors being coupled to the respective bases of a second pair of transistors of said first and second pair of differential transistors; and second signal supply means coupled to said switching means for supplying said second signal to said switching means.

2. A multiplier circuit according to claim 1, wherein said first signal is supplied to the bases of said first and second differential pair of transistors via buffer transistors.

3. A circuit according to claim 1, wherein said first and second differential amplifier means comprise:

first to fourth transistors, which each have bases, collectors and emitters, the collector of said first transistor being connected to the collector of said fourth transistor, the emitter of said first transistor being connected to the emitter of said third transistor, the collector of said second transistor being connected to the collector of said third transistor, the emitter of said second transistor being connected to the emitter of said fourth transistor, said first and second transistors forming said first differential pair of transistors, and said third and fourth transistors forming said second differential pair of transistors;

first resistor means connected between the emitters of said first and second transistors;

second resistor means connected between the emitters of said third and fourth transistors.

4. A circuit according to claim 3, wherein said first and second resistor means comprise a first resistor, one terminal of which is connected to a node of the emitters of said first and third transistors, and a second resistor, one terminal of which is connected to a node of the emitters of said second and fourth transistors, the other terminal of said second resistor being connected to the other terminal of said first resistor; and said circuit further comprising a constant current source, which is connected to a node of said first and second resistors.

5. A circuit comprising:

first differential amplifier means, for differentially amplifying a first signal, and including a first differential pair of transistors, and first and second output terminals from which first and second differentially amplified signals having opposite phases are output, said first differential pair of transistors comprising first and second transistors, which each have bases, collectors and emitters, the collector of said first transistor being connected to said first output terminal, the collector of said second transistor being connected to said second output terminal, and first resistor means connected between the emitters of said first and second transistors;

second differential amplifier means, for differentially amplifying said first signal, and including a second differential pair of transistors, a third output terminal coupled to said second output terminal from which a third differentially amplified signal is output in phase with said first differentially amplified signal, and a fourth output terminal coupled to said first output terminal from which a fourth differentially amplified signal is output in phase with said second differentially amplified signal, said second differential pair of transistors comprising third and fourth transistors, which each have bases, collectors and emitters, the collector of said third transistor being connected to said third output terminal, the collector of said fourth transistor being connected to said fourth output terminal, and second resistor means connected between the emitters of said third and fourth transistors;

first signal supply means coupled to said first and second differential amplifier means, for supplying said first signal to said first and second differential amplifier means;

load means coupled to at least either node of said first and fourth output terminals of said first and second differential amplifier means or the node of said second and third output terminals;

switching means for controlling the voltage of the bases of said first and second differential pairs of transistors in response to a second signal to selectively operate said first and second differential amplifier means, and for obtaining a product signal of said first and second signals from the node of said load means and said first and second differential amplifier means; and second signal supply means coupled to said switching means for supplying said second signal to said switching means.

6. A circuit according to claim 5, wherein said first and second resistor means comprise a first resistor, one terminal of which is connected to a node of the emitters of said first and third transistors, and a second resistor, one terminal of which is connected to a node of the emitters of said second and fourth transistors, the other terminal of said second resistor being connected to the other terminal of said first resistor; and said circuit further comprising a constant current source, which is connected to a node of said first and second resistors.

7. A circuit according to claim 5, wherein said first signal is supplied to the bases of said first and second differential pair of transistors via buffer transistors.

8. A circuit comprising:

first and second transistors of a first pair of transistors, the emitters of which are connected in common, for differentially amplifying a first signal;

third and fourth transistors of a second pair of transistors, the emitters of which are connected in common, for differentially amplifying said first signal, the collector of said third transistor being connected to the collector of said second transistor, and the collector of said fourth transistor being connected to the collector of said first transistor;

fifth and sixth transistors of a third pair of transistors, the emitters of which are connected in common, the collector of said fifth transistor being connected to the base of said first transistor, the collector of said sixth transistor being connected to the base of said third transistor, and said fifth and sixth transistors selectively turning said first and third transistors on and off in response to a second signal;

seventh and eighth transistors of a fourth pair of transistors, the emitters of which are connected in common, the collector of said seventh transistor being connected to the base of said second transistor, the collector of said eighth transistor being connected to the base of said fourth transistor, and said seventh and eighth transistors selectively turning said second and fourth transistors on and off in response to said second signal;

a load circuit connected to at least one node of the collectors of said first and fourth transistors and the collectors of said second and third transistors;

at least one output terminal connected to said load circuit for extracting a product output of said first and second signals;

first signal supply means coupled to said first to fourth transistors for supplying said first signal to said firat to fourth transistors; and second signal supply means coupled to said fifth to eighth transistors for supplying said second signal to said fifth to eighth transistors.

9. A circuit according to claim 8, further comprising:

first resistor means connected between the emitters of said first and second transistors; and second resistor means connected between the emitters of said third and fourth transistors.

10. A circuit according to claim 9, wherein said first and second resistor means comprises a first resistor, one terminal of which is connected to a node of the emitters of said first and third transistors, and a second resistor, one terminal of which is connected to a node of the emitters of said second and fourth transistors, the other terminal of said second resistor being connected to the other terminal of said first resistor; and wherein said circuit further comprises a constant current source, which is connected to a node of said first and second resistors.

11. A circuit according to claim 8, wherein said first signal is supplied to the bases of said first and second pairs of transistors via buffer transistors.

* * * * *